United States Patent
Lim et al.

(10) Patent No.: US 8,911,884 B2
(45) Date of Patent: Dec. 16, 2014

(54) ORGANIC LIGHT EMITTING DEVICE

(75) Inventors: Choon-Woo Lim, Suwon-si (KR);
Kwan-Hee Lee, Suwon-si (KR);
Kyung-Hoon Choi, Suwon-si (KR);
Dong-Hun Kim, Suwon-si (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 802 days.

(21) Appl. No.: 12/372,970

(22) Filed: Feb. 18, 2009

(65) Prior Publication Data
US 2009/0206744 A1    Aug. 20, 2009

(30) Foreign Application Priority Data
Feb. 20, 2008  (KR) .................. 10-2008-0015477

(51) Int. Cl.
*H01J 1/62* (2006.01)
*H01L 51/00* (2006.01)
*H01L 51/50* (2006.01)

(52) U.S. Cl.
CPC ....... *H01L 51/0061* (2013.01); *H01L 2251/552* (2013.01); *H01L 51/0077* (2013.01); *H01L 51/0072* (2013.01); *H01L 2251/308* (2013.01); *H01L 51/5016* (2013.01); *H01L 51/0085* (2013.01); *H01L 51/0092* (2013.01); *H01L 51/5048* (2013.01); *Y10S 428/917* (2013.01)
USPC ........ 428/690; 428/917; 428/411.1; 428/336; 532/1

(58) Field of Classification Search
USPC .......................................... 429/480
See application file for complete search history.

(56) References Cited

U.S. PATENT DOCUMENTS

| | | | |
|---|---|---|---|
| 6,337,102 B1 * | 1/2002 | Forrest et al. | ................... 427/64 |
| 2005/0106419 A1 | 5/2005 | Endoh et al. | |
| 2005/0175858 A1 | 8/2005 | Jung et al. | |
| 2007/0141396 A1 | 6/2007 | Chun et al. | |
| 2007/0205411 A1 * | 9/2007 | Itai | ................... 257/40 |
| 2008/0272689 A1 * | 11/2008 | Ide et al. | ...................... 313/504 |

FOREIGN PATENT DOCUMENTS

| | | | | |
|---|---|---|---|---|
| JP | 2005-166641 A | | 6/2005 | |
| JP | 2006-151979 | | 6/2006 | |
| JP | 2006-151979 A | * | 6/2006 | ........... C07D 209/88 |
| KR | 2005-40960 | | 5/2005 | |
| KR | 10-2006-0002730 | | 1/2006 | |
| KR | 10-2007-0065546 | | 6/2007 | |
| KR | 10-2007-0068147 | | 6/2007 | |
| KR | 10-2007-0093881 | | 9/2007 | |
| WO | 2005/064994 | | 7/2005 | |
| WO | WO 2005/094130 | * | 10/2005 | ............. H05B 33/02 |

OTHER PUBLICATIONS

Machine English translation of JP 2006-151979 A. Mar. 24, 2011.*

(Continued)

*Primary Examiner* — J. L. Yang
(74) *Attorney, Agent, or Firm* — Robert E. Bushnell, Esq.

(57) ABSTRACT

An organic light emitting device includes a substrate; a first electrode; a second electrode; and an organic layer including an emission layer between the first electrode and the second electrode. The organic layer includes a first intermediate layer including a first host and a first dopant, a second intermediate layer including the first dopant, and a third intermediate layer including a second host and the first dopant interposed between the first electrode and the emission layer. The organic light emitting device has a long lifetime.

16 Claims, 2 Drawing Sheets

(56) References Cited

OTHER PUBLICATIONS

Registration Determination Certificate issued on Sep. 30, 2009, for corresponding Korean Patent Application No. 2009-040777831.

Japanese Office action issued by the JPO on Sep. 18, 2012 in the corresponding Japanese patent application No. 2009-038444.
Japanese Office Action issued on Oct. 18, 2011 in the corresponding Japanese Patent application No. 2009-038444.

* cited by examiner

ORGANIC LIGHT EMITTING DEVICE

CROSS-REFERENCE TO RELATED APPLICATION

This application claims the benefit of Korean Application No. 2008-15477, filed Feb. 20, 2008, in the Korean Intellectual Property Office, the disclosure of which is incorporated herein by reference.

BACKGROUND OF THE INVENTION

1. Field of the Invention

Aspects of the present invention relates to an organic light emitting device, and more particularly, to an organic light emitting device including a first intermediate layer comprising a first host and a first dopant, a second intermediate layer comprising the first dopant, and a third intermediate layer comprising a second host and the first dopant, between a first electrode and an emission layer.

2. Description of the Related Art

Organic light emitting devices are self emission devices and have wide viewing angles, excellent contrast characteristics, and quick response speeds. Due to these advantages, organic light emitting devices are receiving much attention. Also, research into organic light emitting devices is being actively performed due to their low operating voltages, quick response speeds, and multi-color capabilities.

In general, an organic light emitting device has a stack structure of anode/emission layer/cathode. In addition, a hole injection layer, a hole transport layer, and an electron injection layer can be additionally disposed between the anode and the emission layer or between the emission layer and the cathode so as to obtain a stack structure of anode/hole transport layer/emission layer/cathode, anode/hole transport layer/emission layer/electron injection layer/cathode, or the like. For example, the structure of conventional organic light emitting devices is disclosed in KR 2005-0040960.

However, a conventional organic light emitting device has relatively poor lifetime characteristics. Therefore, there is a need to develop an organic light emitting device having good lifetime characteristics.

SUMMARY OF THE INVENTION

Aspects of the present invention provide an organic light emitting device having a long lifetime and including intermediate layers between a first electrode and an emission layer.

According to an embodiment of the present invention, there is provided an organic light emitting device comprising: a substrate; a first electrode; a second electrode; and an organic layer. The organic layer comprises an emission layer between the first electrode and the second electrode, and a first intermediate layer, a second intermediate layer and a third intermediate layer interposed between the first electrode and the emission layer. The first intermediate layer includes a first host and a first dopant, the second intermediate layer includes the first dopant and does not include a host, and the third intermediate layer includes a second host and the first dopant.

According to another embodiment of the present invention, there is provided an organic layer of an organic light emitting device, comprising: an emission layer; a first intermediate layer including a first host and a first dopant; a second intermediate layer including the first dopant and not including a host; and a third intermediate layer including a second host and the first dopant; wherein the third intermediate layer is adjacent the emission layer, the second intermediate layer is disposed on the third intermediate layer and the first intermediate layer is disposed on the second intermediate layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures. Herein, it is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process An organic light emitting device according to aspects of the present invention includes: a substrate; a first electrode; a second electrode; and an organic layer including an emission layer interposed between the first electrode and the second electrode, wherein the organic layer includes a first intermediate layer including a first host and a first dopant, a second intermediate layer including the first dopant, and a third intermediate layer including a second host and the first dopant, interposed between the first electrode and the emission layer.

Figure 1:
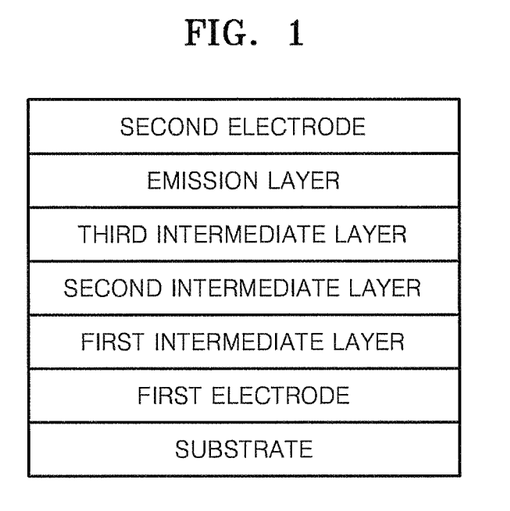
FIG. 1 is a schematic sectional view of an organic light emitting device according to an embodiment of the present invention.

FIG. 1 is a schematic sectional view of an organic light emitting device according to an embodiment of the present invention. The organic light emitting device according to FIG. 1 has a stack structure including a substrate, a first electrode, a first intermediate layer, a second intermediate layer, a third intermediate layer, an emission layer and a second electrode formed in this order.

The organic layer of the organic light emitting device according to aspects of the present invention may further include at least one layer selected from a hole blocking layer, an electron transport layer, and an electron injection layer, in addition to the first intermediate layer, the second intermediate layer, the third intermediate layer and the emission layer.

Figure 2:
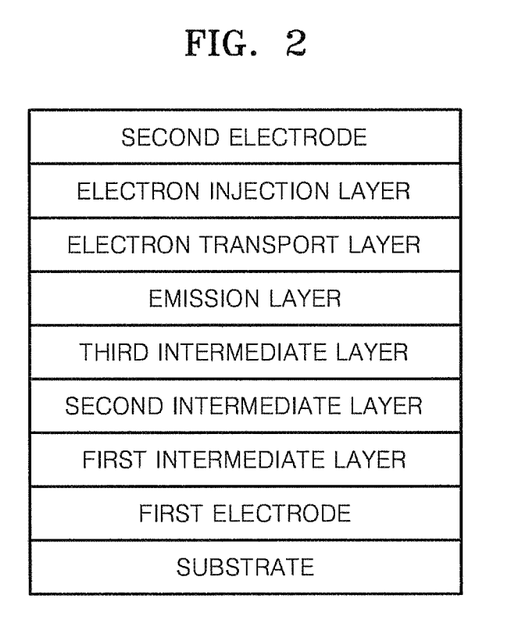
FIG. 2 is a schematic sectional view of an organic light emitting device according to another embodiment of the present invention.

FIG. 2 is a schematic sectional view of an organic light emitting device according to another embodiment of the present invention. The organic light emitting device according to FIG. 2 has a stack structure of a substrate, a first electrode, a first intermediate layer, a second intermediate layer, a third intermediate layer, an emission layer, an electron transport layer, an electron injection layer, and a second electrode formed in this order. Hereinafter, the organic light emitting device according to aspects the present invention and a method of preparing the same will be described in detail with reference to the organic light emitting device of FIG. 2, but it is to be understood that there may be more or fewer additional layers than what is shown in FIG. 2.

The substrate can be any substrate that is used in a conventional organic light emitting device. For example, the substrate can be a transparent plastic substrate or a glass substrate that has high mechanical stability, high thermal stability, and a smooth surface, is transparent and waterproof, and can be easily handled. Although not illustrated in FIG. 2, a planarization layer and an insulating layer may be further deposited between the substrate and the first electrode.

The first electrode is formed on the substrate. The first electrode may be patterned according to each of a plurality of red, green, and blue sub pixels. The first electrode can be an anode or a cathode. The first electrode may be a transparent electrode, a semi-transparent electrode, or a reflective electrode. The first electrode may be formed of indium tin oxide (ITO), indium zinc oxide (IZO), tin oxide ($SnO_2$), or zinc oxide (ZnO), Al, Ag, or Mg. However, it is to be understood that the first electrode can be formed of other materials. For example, the first electrode may have a stack structure of two or more layers formed of different materials.

Although not illustrated in FIG. 2, an insulating layer may be formed at edges of the first electrode. The insulating layer may act as a pixel insulating layer when an organic light emitting device according to aspects of the present invention displays a full-color image. The insulating layer may be formed of any insulating material. For example, the insulating layer may be formed of an inorganic material such as $SiO_2$ or $SiN_x$, or an organic material such as a polyimide-based resin or acryl-based resin.

The first intermediate layer, the second intermediate layer, and the third intermediate layer may be sequentially formed on the first electrode in this order. The first intermediate layer includes a first host and a first dopant, the second intermediate layer includes the first dopant, and the third intermediate layer includes a second host and the first dopant.

Each of the first host and the second host may have a highest occupied molecular orbital (HOMO) level of $-5.5\pm1.0$ eV, or more specifically, $-5.5\pm0.5$ eV. The first dopant may have a lowest unoccupied molecular orbital (LUMO) level of $-5.5\pm1.0$ eV, or more specifically, $-5.5\pm0.5$ eV.

Specifically, the absolute difference between the HOMO level of the first host and the LUMO level of the first dopant, and the absolute difference between the HOMO level of the second host and the LUMO level of the first dopant may be each independently in a range of 0 eV to 0.5 eV, or more specifically, in a range of 0 eV to 0.2 eV.

Generally, in an organic light emitting device, holes flowing from an anode to an organic layer move more quickly than electrons flowing from a cathode to the organic layer, and thus, such difference in the flowing speeds of holes and electrons may cause deterioration of the organic light emitting device during its operation. However, when a host having the HOMO level range described above and a dopant having the LUMO level range described above are used to form the first intermediate layer, the second intermediate layer and the third intermediate layer, the flowing speed of holes and electrons are balanced with each other and thus holes and electrons are efficiently recombined each other, thereby increasing the lifetime of the organic light emitting device.

The first host and the second host may be each independently a hole transporting or injection material having the HOMO level range described above. The first host and the second host may be identical to or different from each other.

Specifically, each of the first host and the second host may be, but is not limited to, a phthalocyanine-based compound; a carbazole derivative, such as N-phenylcarbazole or polyvinylcarbazole; a conventional amine derivative having an aromatic condensation ring, such as 4,4'-bis[N-(1-naphthyl)-N-phenylamino]biphenyl (NPB), N,N'-bis(3-methylphenyl)-N,N'-diphenyl-[1,1-biphenyl]-4,4'-diamine(TPD), or N,N'-di (naphthalen-1-yl)-N,N'-diphenyl benzidine(α-NPD); TCTA (shown below); m-MTDATA (shown below); 1,3,5-tris[4-(3-methylphenylphenylamino)phenyl]benzene (m-MTDAPB); polyaniline/dodecylbenzene sulfonic acid (Pani/DBSA); poly(3,4-ethylenedioxythiophene)/poly(4-styrenesulfonate) (PEDOT/PSS); polyaniline/camphor sulfonic acid (Pani/CSA); (polyaniline)/poly(4-styrenesulfonate) (PANI/PSS); or a compound represented by Formula 1 below:

TCTA m-MTDATA

<Formula 1> where X may be, but is not limited to, a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, or a substituted or unsubstituted $C_2$-$C_{30}$ hetero arylene group. Specifically, X may be a substituted or unsubstituted $C_1$-$C_{10}$ alkylene group, a substituted or unsubstituted $C_2$-$C_{10}$ alkenylene group, a substituted or unsubstituted $C_6$-$C_{12}$ arylene group, or a substituted or unsubstituted $C_2$-$C_{12}$ hetero arylene group, and more specifically, a phenylene group, a naphthylene group, or an anthracenylene group.

In Formula 1, n is an integer in the range of 1 to 5, or more specifically, an integer in the range of 1 to 3.

In Formula 1, $R_1$, $R_2$, and $R_3$ are each independently a hydrogen atom, a halogen atom, a hydroxyl group, a cyano group, an amino group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, or a substituted or unsubstituted $C_4$-$C_{30}$ heteroaryl group, and at least two of $R_1$, $R_2$, and $R_3$ may be combined to form a saturated or unsaturated ring. Specifically, $R_1$, $R_2$, and $R_3$ may be each independently a hydrogen atom, a hydroxyl group, a cyano group, an amino group, a substituted or unsubstituted $C_1$-$C_{10}$ alkyl group, a substituted or unsubstituted $C_1$-$C_{10}$ alkoxy group, a substituted or unsubstituted $C_6$-$C_{12}$ aryl group, or a substituted or unsubstituted $C_4$-$C_{12}$ heteroaryl group or at least two of $R_1$, $R_2$, and $R_3$ may be combined to form a saturated or unsaturated ring.

In Formula 1, Ar is a substituted or unsubstituted $C_6$-$C_{30}$ aryl group or a substituted or unsubstituted $C_2$-$C_{30}$ heteroaryl group. Specifically, Ar may be a substituted or unsubstituted $C_6$-$C_{12}$ aryl group or a substituted or unsubstituted $C_2$-$C_{12}$ heteroaryl group. More specifically, Ar may be a phenyl group or a naphthyl group, but is not limited thereto.

The compound represented by Formula 1 may be a compound represented by Formula 2 below:

<Formula 2> where $R_1$, $R_2$, and $R_3$ are each independently a hydrogen atom, a halogen atom, a hydroxyl group, a cyano group, an amino group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, or a substituted or unsubstituted $C_4$-$C_{30}$ heteroaryl group, and at least two of $R_1$, $R_2$, and $R_3$ may be combined to form a saturated or unsaturated ring.

In Formula 2, R may be a hydrogen atom, a cyano group, a fluoride, or a substituted or unsubstituted $C_1$-$C_{30}$ alkyl group, or a substituted or unsubstituted $C_6$-$C_{30}$ aryl group, a substituted or unsubstituted $C_4$-$C_{30}$ hetero ring, or a substituted or unsubstituted amino group.

The compound represented by Formula 1 may be Compound 1 or Compound 2 below, but is not limited thereto:

<Compound 1>

<Compound 2>

Compound 1 may have a HOMO level of −5.16 eV, and a LUMO level of −2.16 eV.

The first dopant may have the LUMO level described above. Specifically, the first dopant may be a p-dopant. For example, the first dopant may be a $C_6$-$C_{30}$ aromatic compound in which at least one group selected from a cyano group and a fluorine group is substituted, or a $C_6$-$C_{30}$ heteroaromatic compound in which at least one group selected from a cyano group and a fluorine group is substituted, but is not limited thereto.

Specifically, the first dopant may be Compound 3 or Compound 4 below, but is not limited thereto:

<Compound 3>

<Compound 4> where Compound 3 has a HOMO level of −7.57 eV and a LUMO level of −5.34 eV, and Compound 4 has a HOMO level of −7.1 eV and a LUMO level of −5.38 eV.

In the first intermediate layer, the amount of the first dopant may be in a range of 0.1 parts by weight to 10 parts by weight, or more specifically, 0.2 parts by weight to 2 parts by weight, based on 100 parts by weight of the total amount of the first host and the first dopant. In the third intermediate layer, the amount of the first dopant may be in a range of 0.1 parts by weight to 10 parts by weight, specifically 0.2 parts by weight to 2 parts by weight, based on 100 parts by weight of the total amount of the second host and the first dopant. If the amount of the first dopant is within the above range, concentration quenching may be suppressed.

Each of the first intermediate layer and the third intermediate layer may have a thickness of 10 Å to 1000 Å, or more specifically, 20 Å to 800 Å. The second intermediate layer may have a thickness of 10 Å to 100 Å, or more specifically, 20 Å to 50 Å. When the first intermediate layer and the third intermediate layer have such thickness ranges, an increase in operating voltage can be substantially prevented.

The first intermediate layer, the second intermediate layer and the third intermediate layer may be formed using a vacuum deposition method, a spin coating method, a casting method, or a Langmuir Blodgett (LB) deposition method.

When the first intermediate layer, the second intermediate layer and the third intermediate layer are formed using a vacuum deposition method, the deposition conditions may vary according to thermal characteristics of the compound used in the respective intermediate layers. As a non-limiting example, the vacuum temperature may be in a range of 100 to 500° C., the degree of vacuum may be in a range of $10^{-8}$ to $10^{-3}$ torr, and the vacuum speed may be in a range of 0.01 to 100 Å/sec.

An emission layer may be formed on the third intermediate layer using a vacuum deposition method, a spin coating method, a casting method, or a LB deposition method. The conditions for forming the emission layer may vary according to the kind of compound that is used to form the emission layer. For example, the conditions for forming the emission layer may be similar to the conditions for forming the first intermediate layer, the second intermediate layer and the third intermediate layer.

The emission layer may be formed using a known light-emitting material, such as, for example, a known emission layer host material and a known emission layer dopant material.

The known host material for the emission layer may be Alq3 or CBP(4,4'-N,N'-dicarbazole-biphenyl), poly(n-vinylcarbazole) (PVK), 9,10-di(naphthalene-2-yl)anthracene

(ADN), or bis[2-(2-hydroxyphenyl)benzothiazolate]zinc (Zn(BTZ)$_2$), but the emission layer host material is not limited thereto.

PVK

ADN

The known dopant material for the emission layer may be a red dopant material such as platinum(II) octaethylporphyrin (PtOEP), Ir(piq)$_3$, Btp$_2$Ir(acac), or DCJTB (all shown below), but the emission layer dopant material is not limited thereto.

PtOEP

Ir(piq)$_3$

Btp$_2$Ir(acac)

The known dopant material for the emission layer may be a green dopant such as Ir(ppy)$_3$ (ppy=phenylpyridine), Ir(ppy)$_2$(acac), Ir(mpyp)$_3$, (shown below) or C545T, but the emission layer dopant material is not limited thereto.

Ir(ppy)$_3$

Ir(ppy)$_2$(acac)

Ir(mpyp)$_3$

The known dopant material for the emission layer may be a blue dopant such as F$_2$Irpic (shown below), (F$_2$ppy)$_2$Ir(tmd) (shown below), Ir(dfppz)$_3$ (shown below), ter-fluorene, 4,4'-bis(4-diphenylaminostyryl biphenyl (DPAVBi) (shown below), 2,5,8,11-tetra-tert-butyl perylene (TBP) (shown below), Compound 5 (shown below), Firpric (shown below), or Ir(piq)$_3$ (tris(1-phenylisoquinoline) iridium (III)), but the emission layer dopant material is not limited thereto.

F₂Irpic (F₂ppy)₂Ir(tmd)

Ir(dfppz)₃

DPAVBi

TBP

<Compound 5>

Firpric

When an emission layer dopant material and an emission layer host material are used together, the doping concentration of the emission layer dopant material is not limited. As a non-limiting example, the amount of the emission layer dopant material may be in a range of 0.01 to 20 parts by weight based on 100 parts by weight of the emission layer host material.

The thickness of the emission layer may be in a range of about 100 Å to 1000 Å, or more specifically, in a range of 200 Å to 600 Å. When the emission layer has such a thickness range, excellent luminescence characteristics can be obtained without a substantial decrease in the operating voltage.

When the emission layer is formed using a phosphorescent dopant material, a hole blocking layer (HBL) (not shown in FIG. 2) may be further formed to prevent diffusion of triple excitons or holes into the electron transport layer. When the HBL is formed using a vacuum deposition method or a spin coating method, the vacuum deposition conditions and the spin coating conditions may vary according to the type of compound used. In general, the vacuum deposition conditions and the spin coating conditions may be similar to those used for forming the first intermediate layer, etc. A hole blocking material used to form the HBL can be any material that blocks the flow of holes. For example, the hole blocking material may be an oxadiazole derivative, a triazole derivative, or a phenanthroline derivative.

The thickness of the HBL may be in a range of about 50 Å to 1000 Å, or more specifically, in a range of 100 Å to 300 Å. When the HBL has such a thickness range as described above, excellent hole blocking characteristics can be obtained without a substantial decrease in the operating voltage.

Then, the electron transport layer (ETL) may be formed using a vacuum deposition method, a spin coating method, or a casting method. When the ETL is formed using a vacuum deposition method or a spin coating method, the vacuum deposition conditions and the spin coating conditions may vary according to the type of compound used. In general, the conditions for forming the ETL may be similar to those for forming the first intermediate layer. The ETL may be formed of a material that can stably transport electrons injected from an electron injection electrode, that is, from the second electrode or cathode. For example, the material used to form the ETL may be quinoline derivative, specifically tris(8-quinolinolate)aluminum (Alq3), TAZ (shown below), bis-(2-methyl-8-quinolinolate)-4-(phenylphenolato)-aluminum (Balq), or Compound 6 (shown below), but is not limited thereto.

The thickness of the ETL may be in a range of about 100 Å to 1000 Å, specifically in a range of 150 Å to 500 Å. When the ETL has such a thickness range as described above, sufficient electron transporting characteristics can be obtained without a substantial decrease in the operating voltage.

The electron injection layer (EIL) can be deposited on the ETL to allow an easy injection of electrons from the second electrode. The material to form the EIL is not limited and may be any known electron injection material. For example, the material for forming the EIL may be, but is not limited to, lithium quinolate (LiQ), LiF, NaCl, CsF, $Li_2O$, or BaO. The conditions for depositing the EIL may vary according to the type of compound used. For example, the conditions for depositing the EIL may be similar to the conditions for forming the first intermediate layer.

The thickness of the EIL may be in a range of about 1 Å to 100 Å, or more specifically, 5 Å to 50 Å. When the EIL has such thickness range as described above, sufficient electron injection characteristics can be obtained without a substantial decrease in the operating voltage.

The second electrode may be formed on the EIL using a vacuum deposition method or a spin coating method. The second electrode may act as a cathode. A material for forming the second electrode may be a metal, alloy, an electrically conductive compound, or a mixture thereof, each of which has a low work function. Specifically, the material for forming the second electrode may be Li, Mg, Al, Al—Li, Ca, Mg—In, or Mg—Ag. In addition, in the case of a front emission-type light emitting device, the second electrode may be a transparent cathode formed of ITO or IZO.

As used herein, the term "$C_1$-$C_{30}$ alkyl group" refers to any alkyl group having 1 to 30 carbon atoms. As non-limiting examples, the unsubstituted $C_1$-$C_{30}$ alkyl group may be methyl, ethyl, propyl, isobutyl, sec-isobutyl, pentyl, isoamyl, or hexyl. In these alkyl groups, at least one hydrogen atom may be substituted with a halogen atom, a hydroxyl group, a nitro group, a cyano group, an amino group, an amidino group, hydrazine, hydrazone, a carboxylic group or a salt thereof, a sulfuric acid group or a salt thereof, a phosphoric acid or a salt thereof, a $C_1$-$C_{30}$ alkyl group, a $C_1$-$C_{30}$ alkenyl group, a $C_1$-$C_{30}$ alkynyl group, a $C_6$-$C_{30}$ aryl group, a $C_7$-$C_{20}$ aryl alkyl group, a $C_2$-$C_{20}$ heteroaryl group, a $C_3$-$C_{30}$ heteroarylalkyl group, a $C_6$-$C_{30}$ aryloxy group or a compound represented by the formula —$N(Z_1)(Z_2)$ where $Z_1$ and $Z_2$ may be each independently a hydrogen atom, a substituted or unsubstituted $C_1$-$C_{30}$ alkyl group, a substituted or unsubstituted $C_6$-$C_{30}$ aryl group, or a substituted or unsubstituted $C_2$-$C_{30}$ heteroaryl group.

As used herein, the term "$C_1$-$C_{30}$ alkoxy group" refers to a group represented by a formula of —OA where A is a $C_1$-$C_{30}$ alkyl group such as, for example one of the alkyl groups described above. As non-limiting examples, the unsubstituted $C_1$-$C_{30}$ alkoxy group may be methoxy, ethoxy, phenyloxy, cyclohexyloxy, naphthyloxy, isopropyloxy, or diphenyloxy. In these alkoxy groups, at least one hydrogen atom may be substituted with the substituents described with reference to the alkyl groups described above.

As used herein, the term "$C_2$-$C_{30}$ alkenyl group" refers a group including a carbon double bond in the middle or end of an alkyl group described above. For example, the unsubstituted $C_2$-$C_{30}$ alkenyl group may be ethylene, propylene, isobutylene, or hexylene. In these alkenyl groups, at least one hydrogen atom may be substituted with the substituents described with reference to the alkyl group described above.

As used herein, the term "$C_6$-$C_{30}$ aryl group" refers to a monovalent group including a $C_6$-$C_{30}$ carbocyclic aromatic system having at least one aromatic ring in which at least two rings may be fused together or connected through a single bond. The $C_6$-$C_{30}$ aryl group may be unsubstituted or at least one hydrogen atom may be substituted with the substituents described with reference to the alkyl group described above.

As non-limiting examples, the substituted or unsubstituted $C_6$-$C_{30}$ aryl group may be a phenyl group, a $C_1$-$C_{10}$ alkyl phenyl group (for example, an ethyl phenyl group), a halo phenyl group (for example, an o-, m- and p-fluoro phenyl group, or a dichloro phenyl group), a cyano phenyl group, a dicyano phenyl group, a trifluoromethoxy phenyl group, a biphenyl group, a halobiphenyl group, a cyanobiphenyl group, a $C_1$-$C_{10}$ biphenyl group, a $C_1$-$C_{10}$ alkoxybiphenyl group, an o-, m-, and p-tolyl group, an o-, m- and p-cumenyl group, a mesityl group, a phenoxy phenyl group, a (α,α-dimethylbenzene) phenyl group, an (N,N'-dimethyl)amino phenyl group, a (N,N'-diphenyl)amino phenyl group, an pentalenyl group, an indenyl group, a naphthyl group, a halo naphthyl group (for example, a fluoro naphthyl group), a $C_1$-$C_{10}$ alkyl naphthyl group (for example, a methyl naphthyl group), a $C_1$-$C_{10}$ alkoxy naphthyl group (for example, a methoxy naphthyl group), a cyano naphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, or a ovalenyl group.

As used herein, the term "$C_6$-$C_{30}$ arylene group" refers to a bivalent group having the structure of a $C_6$-$C_{30}$ aryl group as described above. The $C_6$-$C_{30}$ arylene group may be unsubstituted, or at least one hydrogen atom may be substituted with the substituents described with reference to the alkyl group described above.

As used herein, the term "$C_3$-$C_{30}$ heteroaryl group" refers to a monovalent group that consists of at least one aromatic ring, in which at least two rings are fused together or connected through a single bond, in which the ring atoms of each aromatic ring include at least one hetero atom selected from N, O, P and S and the other ring atoms are carbons. The $C_3$-$C_{30}$ heteroaryl group may be unsubstituted or at least one hydrogen atom may be substituted with the substituents described with reference to the alkyl group described above.

As non-limiting examples, the unsubstituted $C_3$-$C_{30}$ heteroaryl group in Formula 1 may be a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, or an isoquinolinyl group. As noted above, the $C_3$-$C_{30}$ heteroaryl groups may be unsubstituted or at least one hydrogen atom may be substituted with the substituents described with reference to the alkyl group described above.

As used herein, the term "$C_6$-$C_{30}$ heteroarylene group" refers to a bivalent group having the structure of the $C_6$-$C_{30}$ heteroaryl group described above. The $C_6$-$C_{30}$ hetero arylene group may be unsubstituted, or at least one hydrogen atom may be substituted with the substituents described with reference to the alkyl group described above.

As used herein, the term "$C_6$-$C_{30}$ aromatic compound" refers to a $C_6$-$C_{30}$ carbocyclic aromatic system including at least one aromatic ring in which at least two rings are fused together or connected through a single bond. As used herein the term "$C_6$-$C_{30}$ heteroaromatic compound" refers to an aromatic system including at least one aromatic ring, in which at least two rings are fused together or connected through a single bond, and in which the ring atoms of each aromatic ring include at least one hetero atom selected from N, O, P and S and the other ring atoms are carbons.

As non-limiting examples, the $C_6$-$C_{30}$ aromatic compound may be benzene, naphthalene, anthracene, azulene, heptalene, acenaphthylene, fluorene, phenalene, phenanthrene, fluoranthene, triphenylene, pyrene, chrysene, or phenylene, but is not limited thereto. As non-limiting examples, the $C_6$-$C_{30}$ heteroaromatic compound may be pyrazole, imidazole, oxazole, thiazole, triazole, tetrazole, oxadiazole, pyridine, pyridazine, pyrimidine, triazine, carbazole, indole, quinoline, or isoquinoline, but is not limited thereto.

An organic light emitting device according to aspects of the present invention has been described with reference to the organic light emitting device of FIG. 2. However, the organic light emitting device according to aspects of the present invention is not limited thereto and can have various structures.

Aspects of the present invention will be described in further detail with reference to the following examples. These examples are for illustrative purposes only and are not intended to limit the scope of the present invention.

EXAMPLE 1

An organic light emitting device having the following structure was manufactured: ITO/first intermediate layer (Compound 1 and Compound 3, at a doping concentration of 1 wt %) (750 Å)/second intermediate layer (Compound 3) (30

Å)/third intermediate layer (Compound 1 and Compound 3, at a doping concentration of 1 wt %) (750 Å)/emission layer $(Zn(BTZ)_2/Ir(PPy)_3$, at a doping concentration of 15 wt %) (400 Å)/electron transport layer (Compound 6) (300 Å)/electron injection layer (LiQ) (10 Å)/MgAg (160 Å).

To prepare an anode, a 15 Ω/cm$^2$ (1200 Å) ITO glass substrate produced by Corning Co. was cut to a size of 50 mm×50 mm×0.7 mm and washed with ultrasonic waves in isopropyl alcohol and pure water each for five minutes. Then ultraviolet rays were irradiated onto the ITO glass substrate for 30 minutes, and the ITO glass substrate was washed by exposure to ozone and then was loaded into a vacuum deposition device.

Compound 1 and Compound 3 having a doping concentration of 1 wt % were vacuum-deposited on the ITO glass substrate to form a first intermediate layer having a thickness of 750 Å. Then, Compound 3 was vacuum-deposited on the first intermediate layer to form a second intermediate layer having a thickness of 30 Å. Then, Compound 1 and Compound 3 having a doping concentration of 1 wt % were vacuum deposited on the second intermediate layer to form a third intermediate layer having a thickness of 750 Å.

Then, $Zn(BTZ)_2$ and $Ir(PPy)_3$ having a doping concentration of 15 wt % were vacuum-deposited on the third intermediate layer to form an emission layer having a thickness of 400 Å. Then, Compound 6 was vacuum-deposited on the emission layer to form an electron transport layer having a thickness of 300 Å. Then, LiQ was vacuum-deposited on the electron transport layer to form an electron injection layer having a thickness of 10 Å. Then, MgAg(10%) was formed on the electron injection layer to form a cathode having a thickness of 160 Å, thereby completing the manufacture of an organic light emitting device. The obtained organic light emitting device is referred to herein as Sample 1.

COMPARATIVE EXAMPLE A

An organic light emitting device was manufactured in the same manner as in Example 1, except that the first intermediate layer and the third intermediate layer were formed using only Compound 1. The obtained organic light emitting device is referred to herein as Sample A.

COMPARATIVE EXAMPLE B

An organic light emitting device was manufactured in the same manner as in Example 1, except that, instead of forming the first intermediate layer, the second intermediate layer and the third intermediate layer, Compound 1 and Compound 3 having a doping concentration of 1 wt % were vacuum-deposited to form a single layer having a thickness of 1500 Å. The obtained organic light emitting device is referred to herein as Sample B.

ASSESSMENT EXAMPLE

Lifetime Characteristics

Figure 3:
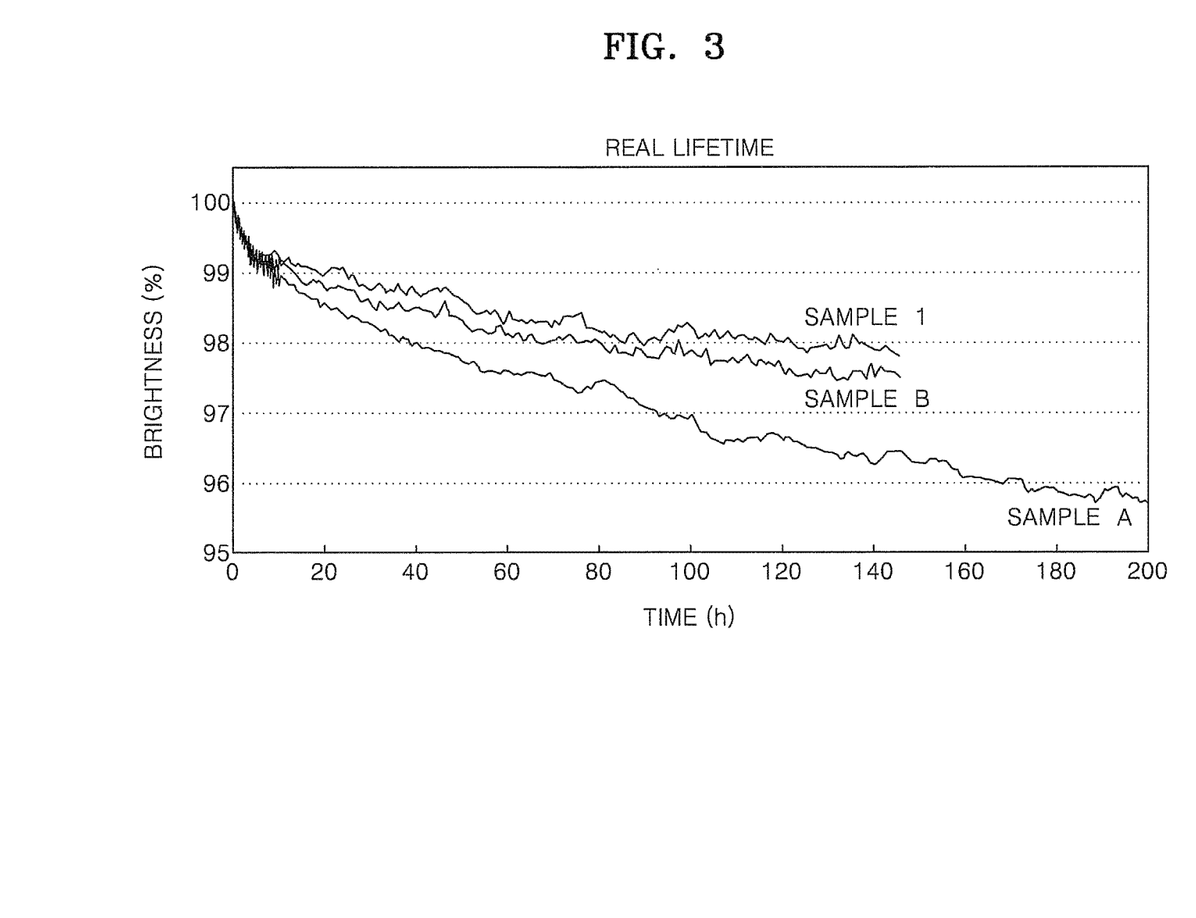
FIG. 3 is a graph of brightness with respect to time of an organic light emitting device according to an embodiment of the present invention (Sample 1) and conventional organic light emitting devices (Sample A and Sample B).

The brightness of Sample 1, Sample A and Sample B with respect to time was measured using a PR650 (Spectroscan spectrometer, produced by PHOTO RESEARCH Inc.) The results are shown in FIG. 3. Referring to FIG. 3, it is seen that the light emitting device of Sample 1 has better lifetime characteristics than the light emitting device of Sample A or Sample B.

An organic light emitting device according to aspects of the present invention described above includes a first intermediate layer including a first host and a first dopant, a second intermediate layer including the first dopant, and a third intermediate layer including a second host and the first dopant, between a first electrode and an emission layer. The inclusion of the first, second, and third intermediate layers leads to an increase in the lifetime of the organic light emitting device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting device comprising:
a substrate;
a first electrode;
a second electrode; and
an organic layer comprising an emission layer between the first electrode and the second electrode, and a first intermediate layer, a second intermediate layer and a third intermediate layer interposed between the first electrode and the emission layer, wherein
the first electrode, the first intermediate layer, the second intermediate layer, the third intermediate layer, and the emission layer are sequentially stacked in this order; and
the first intermediate layer comprising a first host material and a first dopant material, the second intermediate layer consisting of the first dopant material, and the third intermediate layer comprising a second host material and the first dopant material; and
the first dopant material is a $C_6$-$C_{30}$ aromatic compound substituted with at least one group selected from a cyano group and a fluorine group or a $C_6$-$C_{30}$ heteroaromatic compound substituted with at least one group selected from a cyano group and a fluorine group;
a highest occupied molecular orbital (HOMO) level of each of the first host material and the second host material is in a range of −5.5±1.0 eV; and
a lowest unoccupied molecular orbital (LUMO) level of the first dopant material is in a range of −5.5±1.0 eV.

2. The organic light emitting device of claim 1, wherein the absolute difference between the HOMO level of the first host material and the LUMO level of the first dopant material is in a range of 0 to 0.5 eV.

3. The organic light emitting device of claim 1, wherein the absolute difference between the HOMO level of the second host material and the LUMO level of the first dopant material is in a range of 0 to 0.5 eV.

4. The organic light emitting device of claim 1, wherein the first host material and the second host material are each independently a hole transporting material or a hole injecting material.

5. The organic light emitting device of claim 1, wherein the first host material and the second host material are each independently a phthalocyanine-based compound, N-phenylcarbazole, polyvinylcarbazole, 4,4'-bis[N-(1-naphthyl)-N-phenylamino]biphenyl (NPB), N,N'-bis(3-methylphenyl)-N,N'-diphenyl-[1,1-biphenyl]-4,4'-diamine (TPD), N,N'-di (naphthalen-1-yl)-N,N'-diphenyl-benzidine (α-NPD), TCTA, m-MTDATA, 1,3,5-tris[4-(3-methylphenylphenylamino)phenyl]benzene (m-MTDAPB), polyaniline/dodecylbenzenesulfonic acid (Pani/DBSA), poly(3,4-ethylenedioxythiophene)/poly(4-styrenesulfonate)(PEDOT/PSS), polyaniline/camphor sulfonic acid (Pani/CSA), (polyaniline)/poly (4-styrenesulfonate) (PANI/PSS), or a compound represented by Formula 1:

TCTA m-MTDATA

-continued

<Formula 1> where X is a substituted or unsubstituted $C_1$-$C_{30}$ alkylene group, a substituted or unsubstituted $C_2$-$C_{30}$ alkenylene group, a substituted or unsubstituted $C_6$-$C_{30}$ arylene group, or a substituted or unsubstituted $C_2$-$C_{30}$ heteroarylene group;

n is an integer of 1 to 5;

$R_1$, $R_2$, and $R_3$ are each independently a hydrogen atom, a halogen atom, a hydroxyl group, a cyano group, an amino group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, or a substituted or unsubstituted $C_4$-$C_{30}$ heteroaryl group, and wherein at least two of $R_1$, $R_2$, and $R_3$ may be combined together to form a saturated or unsaturated ring; and Ar is a substituted or unsubstituted $C_6$-$C_{30}$ aryl group or a substituted or unsubstituted $C_2$-$C_{30}$ heteroaryl group.

6. The organic light emitting device of claim 1, wherein at least one of the first host material and the second host material is a compound represented by Formula 2 below:

<Formula 2> where $R_1$, $R_2$, and $R_3$ are each independently a hydrogen atom, a halogen atom, a hydroxyl group, a cyano group, an amino group, a substituted or unsubstituted $C_1$-$C_{30}$ alkyl group, a substituted or unsubstituted $C_1$-$C_{30}$ alkoxy group, a substituted or unsubstituted $C_6$-$C_{30}$ aryl group, or a substituted or unsubstituted $C_4$-$C_{30}$ heteroaryl group, and at least two of $R_1$, $R_2$, and $R_3$ may be combined to form a saturated or unsaturated ring; and R is a hydrogen atom, a cyano group, a fluoride, or a substituted or unsubstituted $C_1$-$C_{30}$ alkyl group, or a substituted or unsubstituted $C_6$-$C_{30}$ aryl group, a substituted or unsubstituted $C_4$-$C_{30}$ hetero ring, or a substituted or unsubstituted amino group.

7. The organic light emitting device of claim 1, wherein the first host material and the second host material are identical to each other.

8. The organic light emitting device of claim 1, wherein each of the first host material and the second host material is Compound 1 or Compound 2:

9. The organic light emitting device of claim 1, wherein the first dopant material is a $C_6$-$C_{30}$ aromatic compound selected from the group consisting of benzene, naphthalene, anthracene, azulene, heptalene, acenaphthylene, fluorene, phenalene, phenanthrene, fluoranthene, triphenylene, pyrene, chrysene, and phenylene, and substituted with at least one cyano group or at least one fluorine atom.

10. The organic light emitting device of claim 1, wherein the first dopant material is a $C_6$-$C_{30}$ heteroaromatic compound selected from the group consisting of pyrazole, imidazole, oxazole, thiazole, triazole, tetrazole, oxadiazole, pyridine, pyridazine, pyrimidine, triazine, carbazole, indole, quinoline, and isoquinoline, and substituted with at least one cyano group or at least one fluorine atom.

11. The organic light emitting device of claim 1, wherein the first dopant material is Compound 3 or Compound 4:

12. The organic light emitting device of claim 1, wherein the amount of the first dopant material in the first intermediate layer is in a range of 0.1 parts by weight to 10 parts by weight based on 100 parts by weight of the total weight of the first host material and the first dopant material.

13. The organic light emitting device of claim 1, wherein the amount of the first dopant material in the third intermediate layer is in a range of 0.1 parts by weight to 10 parts by weight based on 100 parts by weight of the total weight of the second host material and the first dopant material.

14. The organic light emitting device of claim 1, wherein each of the first intermediate layer and the third intermediate layer has a thickness of 10 Å to 1000 Å.

15. The organic light emitting device of claim 1, wherein the thickness of the second intermediate layer is in a range of 10 Å to 1000 Å.

16. The organic light emitting device of claim 1, wherein the organic layer further comprises at least one layer selected from the group consisting of a hole blocking layer, an electron transport layer and an electron injection layer.

* * * * *